US010731234B2

(12) United States Patent
Adelmann et al.

(10) Patent No.: US 10,731,234 B2
(45) Date of Patent: Aug. 4, 2020

(54) EXTREME ULTRAVIOLET ABSORBING ALLOYS

(71) Applicants: IMEC VZW, Leuven (BE); Katholieke Universiteit Leuven, KU LEUVEN R&D, Leuven (BE)

(72) Inventors: Hanns Christoph Adelmann, Wilsele (BE); Vicky Philipsen, Tervuren (BE); Kim Vu Luong, Leuven (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 221 days.

(21) Appl. No.: 16/107,343

(22) Filed: Aug. 21, 2018

(65) Prior Publication Data

US 2019/0078177 A1 Mar. 14, 2019

(30) Foreign Application Priority Data

Sep. 9, 2017 (EP) .................................... 17190263

(51) Int. Cl.

| G03F 1/54 | (2012.01) |
|---|---|
| C22C 19/03 | (2006.01) |
| C22C 5/04 | (2006.01) |
| C22C 12/00 | (2006.01) |
| C22C 19/07 | (2006.01) |
| C22C 28/00 | (2006.01) |
| C22C 45/00 | (2006.01) |
| G03F 1/24 | (2012.01) |
| C22C 45/04 | (2006.01) |

(52) U.S. Cl.
CPC ............... *C22C 19/03* (2013.01); *C22C 5/04* (2013.01); *C22C 12/00* (2013.01); *C22C 19/07* (2013.01); *C22C 28/00* (2013.01); *C22C 45/003* (2013.01); *C22C 45/04* (2013.01); *G03F 1/24* (2013.01); *G03F 1/54* (2013.01); *C22C 2200/04* (2013.01)

(58) Field of Classification Search
CPC ... G03F 1/54; G03F 1/24; C22C 19/03; C22C 5/04; C22C 19/07; C22C 12/00; C22C 28/00; C22C 45/003; C22C 45/04
See application file for complete search history.

(56) References Cited

U.S. PATENT DOCUMENTS

| 5,912,104 | A | 6/1999 | Hirotsune et al. |
| 6,165,290 | A | 12/2000 | Rabinkin |
| 6,656,643 | B2 | 12/2003 | Gupta et al. |
| 8,288,062 | B2 | 10/2012 | Hayashi et al. |
| 9,298,081 | B2 | 3/2016 | Sun et al. |
| 9,535,332 | B2 | 1/2017 | Ruoff et al. |
| 9,581,889 | B2 | 2/2017 | Hassan et al. |
| 9,612,522 | B2 | 4/2017 | Hassan et al. |
| 2005/0089708 | A1 | 4/2005 | Maruko et al. |
| 2011/0104595 | A1 | 5/2011 | Hayashi et al. |
| 2013/0164660 | A1 | 6/2013 | Hayashi |
| 2014/0157793 | A1 | 6/2014 | Johnson et al. |
| 2015/0212402 | A1 | 7/2015 | Patil et al. |

FOREIGN PATENT DOCUMENTS

| DE | 513513 | 11/1930 |
| KR | 10-2016-0002332 | 1/2016 |
| KR | 10-2016-0016098 | 2/2016 |
| TW | 201518855 A | 5/2015 |
| TW | 201600919 A | 1/2016 |
| WO | 2011/157643 A1 | 12/2011 |
| WO | 2017/009185 A1 | 1/2017 |

OTHER PUBLICATIONS

Ashley, Dr. Graham et al., "Patentability of Alloys at the European Patent Office", Intellectual Property, vol. 2, No. 3, May 1, 1997, 4 pages.
European Search Report, European Patent Application 17190263.8, dated Mar. 26, 2018, 8 pages.
Philipsen, Vicky et al., "Reducing EUV Mask 3D Effects by Alternative Metal Absorbers", SPIE Advanced Lithography, International Society for Optics and Photonics, vol. 10143, 2017, pp. 1-15.
"Index of Refraction", http://henke.lbl.gov/optical_constants/getdb2. html, retrieved from internet Aug. 21, 2018, 1 page.
CXRO—The Center for X-ray Optics, "Interferometry, Wavefront Control With Sub-Angstrom Sensitivity", http://www.cxro.lbl.gov, retrieved from internet Aug. 21, 2018, 3 pages.
Spiekermann, Peter, "Alloys—A Special Patent Law-Related Problem?—Alloy Examination at the European Patent Office", News from the German Patent Lawyers, vol. 34, 1993, pp. 178-190.

*Primary Examiner* — Jessee R Roe
(74) *Attorney, Agent, or Firm* — McDonnell Boehnen Hulbert & Berghoff LLP

(57) ABSTRACT

Example embodiments relate to extreme ultraviolet absorbing alloys. One example embodiment includes an alloy. The alloy includes one or more first elements selected from: a first list consisting of: Ag, Ni, Co, and Fe; and a second list consisting of: Ru, Rh, Pd, Os, Ir, and Pt. The alloy also includes one or more second elements selected from: the first list, if the one or more first elements are not selected from the first list; and a third list consisting of Sb and Te. An atomic ratio between the one or more first elements and the one or more second elements is between 1:1 and 1:5 if the one or more second elements are selected from the third list and between 1:1 and 1:19 if the one or more second elements are not selected from the third list.

7 Claims, 4 Drawing Sheets

EXTREME ULTRAVIOLET ABSORBING ALLOYS

CROSS-REFERENCE TO RELATED APPLICATIONS

The present application is a non-provisional patent application claiming priority to European Patent Application No. EP 17190263.8, filed Sep. 9, 2017, the contents of which are hereby incorporated by reference.

FIELD OF THE DISCLOSURE

The present disclosure relates to extreme ultraviolet light absorbers and, in particular, to such absorbers used in extreme ultraviolet lithography.

BACKGROUND

In extreme ultraviolet (EUV) lithography, an EUV reticle is typically used from which the EUV light is reflected in a pattern. To this end, the EUV reticle comprises a reflective mirror overlayed by a patterned absorbing layer. Today, TaBN is the most commonly used absorber for this purpose. However, the extinction coefficient of TaBN is such that an absorbing layer thickness in excess of 60 to 70 nm may be used to achieve a sufficient absorbance. At this thickness, 3D mask effects are common, such as different shadowing from different angles of incidence, and reduce the quality of the reflected pattern. 3D mask effects are for example discussed in Philipsen et al. (2017) (Philipsen, Vicky, et al. "Reducing EUV mask 3D effects by alternative metal absorbers." SPIE Advanced Lithography. International Society for Optics and Photonics, 2017).

Materials with a higher EUV extinction coefficient than TaBN are known, such as Ag, Ni, In, Co, Sb, and Te, but come with their own challenges. For example In has a melting temperature of 165° C. and there is therefore a risk of pattern deformation inside the EUV lithography scanner. Sb and Te have too high vapor pressures for long-term thermal stability in the scanner. Ag, Ni, and Co form crystalline layers and are difficult to pattern. Ni and Co are particularly difficult to etch, where issues may include a lack of volatile compounds (making a chemical dry etch difficult), lack of etch selectivity with respect to other materials in the reticle (e.g. Ru), re-deposition of sputter residue, profile control being difficult to achieve, process complexity, etc. U.S. Pat. No. 9,612,522B2 discloses the use of some of these materials in an EUV mask blank.

SUMMARY

Some embodiments provide EUV absorbers. Some embodiments provide structures (e.g. EUV reticles) comprising these EUV absorbers. The above is accomplished by products, methods, and uses according to the present disclosure.

In some embodiments, the EUV absorbers may have a low crystallinity (e.g. they may have an average crystallite size of 10 nm or smaller, or they may be amorphous). In some embodiments, the crystallization temperature of the EUV absorbers may be relatively high (e.g. compared to the operating temperature in a particular application of the absorbers). In some embodiments, the EUV absorbers can be patterned with line etch roughness, e.g. after subtractive patterning.

In some embodiments, the EUV absorbers may have thermal and/or chemical stability.

In some embodiments, the EUV absorbers may have optical properties (e.g. extinction coefficient and/or refractive index). In some embodiments, layers of the EUV absorbers can be made thinner, thus e.g. using less material, while achieving a same or similar absorption. In some embodiments, 3D mask effects can be reduced (which may be particularly relevant for EUV reticles, cf. infra).

In some embodiments, the EUV absorbers can be used in EUV reticles or in other technological areas.

In a first aspect, the present disclosure relates to an alloy comprising:
i. one or more first elements selected within a single of
   a first list consisting of Ag, Ni, Co, and Fe, and
   a second list consisting of Ru, Rh, Pd, Os, Ir, and Pt,
ii. one or more second elements selected within a single of
   the first list, if the one or more first elements were not selected within the first list, and
   a third list consisting of Sb and Te,
iii. optionally one or more third elements selected from the list consisting of B, N, and P, and
iv. optionally one or more fourth elements selected from the list consisting of W, Ta, Hf, Nb, and Mo;
wherein
   an atomic ratio between the one or more first elements on the one hand and the one or more second elements on the other hand is
   from 1:1 to 1:5 if the one or more second elements were chosen in the third list,
   otherwise from 1:1 to 1:19, and
   the one or more third elements, if present, and the one or more fourth elements, if present, together represent from 0 to 20 at % of the alloy, for example from 2 to 15 at %, such as from 5 to 10 at %.

In a second aspect, the present disclosure relates to a reticle for extreme ultraviolet lithography, comprising the alloy as defined in any embodiment of the first aspect.

In a third aspect, the present disclosure relates to a use of the alloy as defined in any embodiment of the first aspect as an extreme ultraviolet absorber.

In a fourth aspect, the present disclosure relates to a method for forming a reticle as defined in embodiments of the second aspect.

Particular aspects are set out in the accompanying independent and dependent claims. Features from the dependent claims may be combined with features of the independent claims and with features of other dependent claims as appropriate and not merely as explicitly set out in the claims.

Although there has been constant improvement, change and evolution of devices in this field, the present concepts are believed to represent substantial new and novel improvements, including departures from prior practices, resulting in the provision of more efficient, stable, and reliable devices of this nature.

The above and other characteristics and features will become apparent from the following detailed description, taken in conjunction with the accompanying drawings, which illustrate, by way of example, various principles. This description is given for the sake of example only, without limiting the scope of the disclosure. The reference figures quoted below refer to the attached drawings.

Figure 1:
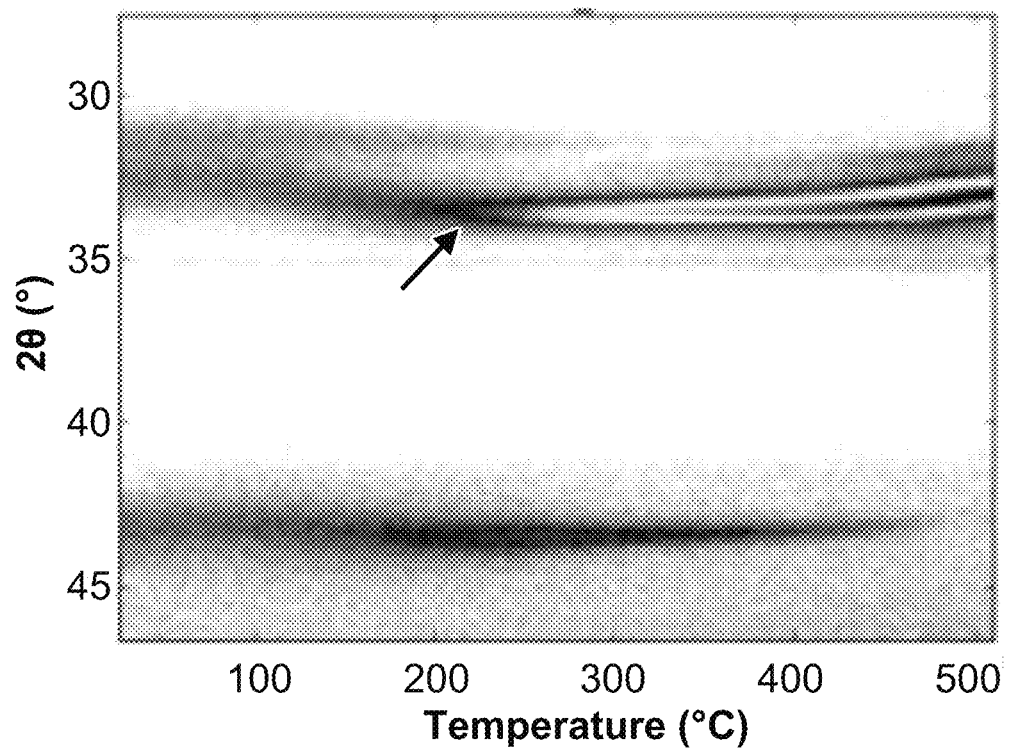
FIG. 1 is an in situ X-ray diffraction spectrum as a function of temperature, according to example embodiments.

In the different figures, the same reference signs refer to the same or analogous elements.

DETAILED DESCRIPTION

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments described herein are capable of operation in other sequences than described or illustrated herein.

Moreover, the terms atop, over, under and the like in the description and the claims are used for descriptive purposes and not necessarily for describing relative positions. It is to be understood that the terms so used are interchangeable with their antonyms under appropriate circumstances and that the embodiments described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof.

Thus, the scope of the expression "a device comprising means A and B" should not be interpreted as being limited to devices consisting only of components A and B. It means that with respect to the present embodiment, the only relevant components of the device are A and B.

Since the term "comprising" does not preclude the presence or addition of one or more other features, integers, steps or components, or groups thereof, this means that the presence of these other features, integers, steps or components or groups thereof are not forbidden and hence also not mandatory.

Thus, the scope of the expression "a device comprising means A and B" should be interpreted as covering the case where the device consist of means A and B and as covering the case where the device does not consist only of components A and B but also includes one or more other components.

Reference throughout this specification to "one embodiment" or "an embodiment" means that a particular feature, structure or characteristic described in connection with the embodiment is included in at least one embodiment. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of example embodiments, various features are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed embodiment requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

Furthermore, some of the embodiments are described herein as a method or combination of elements of a method that can be implemented by a processor of a computer system or by other means of carrying out the function. Thus, a processor with the necessary instructions for carrying out such a method or element of a method forms a means for carrying out the method or element of a method. Furthermore, an element described herein of an apparatus embodiment is an example of a means for carrying out the function performed by the element for the purpose of carrying out various embodiments.

In the description provided herein, numerous specific details are set forth. However, it is understood that embodiments may be practiced without these specific details. In other instances, well-known methods, structures and techniques have not been shown in detail in order not to obscure an understanding of this description.

The following terms are provided solely to aid in understanding.

As used herein, and unless otherwise specified, under extreme ultraviolet (EUV) may be understood that part of the electromagnetic spectrum spanning wavelengths from 124 nm down to 10 nm.

As used herein, and unless otherwise specified, the refractive index (n) and extinction coefficient (κ) are respectively the real and imaginary parts of the complex index of refraction ($\underline{n}=n-i\kappa$). Unless otherwise specified, their values herein are those measured at a wavelength of 13.5 nm. 13.5 nm is the most commonly used wavelength for extreme ultraviolet lithography today, though embodiments are in no way limited to this specific wavelength. Both the refractive index and the extinction coefficient can for example be obtained from angle resolved reflectance measurements, such as from angle-and-wavelength resolved reflectance measurements (thereby increasing the redundancy available to fit both n and κ). Other possibilities include, but are not limited to, transmittance and/or absorbance measurements.

As used herein, and unless otherwise specified, the average crystallite size of an alloy is the average size of crystals within the alloy. It may also be referred to as the grain size.

In a first aspect, the present disclosure relates to an alloy comprising:
  i. one or more first elements selected within a single of
    a first list consisting of Ag, Ni, Co, and Fe, and
    a second list consisting of Ru, Rh, Pd, Os, Ir, and Pt,
  ii. one or more second elements selected within a single of
    the first list, if the one or more first elements were not selected within the first list, and
    a third list consisting of Sb and Te,
  iii. optionally one or more third elements selected from the list consisting of B, N, and P, and
  iv. optionally one or more fourth elements selected from the list consisting of W, Ta, Hf, Nb, and Mo;
wherein
  an atomic ratio between the one or more first elements on the one hand and the one or more second elements on the other hand is
  from 1:1 to 1:5 if the one or more second elements were chosen in the third list,
  otherwise from 1:2 to 1:19, and
  the one or more third elements, if present, and the one or more fourth elements, if present, together represent from 0 to 20 at % of the alloy, for example from 2 to 15 at %, such as from 5 to 10 at %.

Example embodiments of the first aspect relate to an alloy essentially consisting of:
  i. one or more first elements selected within a single of
    a first list consisting of Ag, Ni, Co, and Fe, and
    a second list consisting of Ru, Rh, Pd, Os, Ir, and Pt,
  ii. one or more second elements selected within a single of
    the first list, if the one or more first elements were not selected within the first list, and
    a third list consisting of Sb and Te,
  iii. optionally one or more third elements selected from the list consisting of B, N, and P,
  iv. optionally one or more fourth elements selected from the list consisting of W, Ta, Hf, Nb, and Mo; and
wherein
  an atomic ratio between the one or more first elements on the one hand and the one or more second elements on the other hand is
  from 1:1 to 1:5 if the one or more second elements were chosen in the third list,
  otherwise from 1:2 to 1:19, and
  the one or more third elements, if present, and the one or more fourth elements, if present, together represent from 0 to 20 at % of the alloy, for example from 2 to 15 at %, such as from 5 to 10 at %.

Another embodiment of the first aspect relates to an alloy consisting of:
  i. one or more first elements selected within a single of
    a first list consisting of Ag, Ni, Co, and Fe, and
    a second list consisting of Ru, Rh, Pd, Os, Ir, and Pt,
  ii. one or more second elements selected within a single of
    the first list, if the one or more first elements were not selected within the first list, and
    a third list consisting of Sb and Te,
  iii. optionally one or more third elements selected from the list consisting of B, N, and P,
  iv. optionally one or more fourth elements selected from the list consisting of W, Ta, Hf, Nb, and Mo; and
wherein
  an atomic ratio between the one or more first elements on the one hand and the one or more second elements on the other hand is
  from 1:1 to 1:5 if the one or more second elements were chosen in the third list,
  otherwise from 1:2 to 1:19, and
  the one or more third elements, if present, and the one or more fourth elements, if present, together represent from 0 to 20 at % of the alloy, for example from 2 to 15 at %, such as from 5 to 10 at %.

In any embodiment of the first aspect, the alloy may further comprise usual impurities.

It was recognized that having a high extinction coefficient is not a sufficient property of a material to yield an absorber (i.e. absorbing material) that is practically useful in EUV lithography; additional properties such as crystallinity, refractive index, thermal stability (e.g. with respect to decomposition and/or phase changes) and chemical stability (e.g. to hydrogen damage) have to be considered. The alloys as defined in the first aspect were found to have relatively high extinction coefficients, while not neglecting these further properties. In this context, the absorption of EUV light typically results in ionization of atoms; unlike absorption of e.g. visible light which is normally linked to a transition between molecular energy levels. Because of this, the optical properties (e.g. extinction coefficient) of an alloy with respect to EUV light can typically be adequately predicted by summing up the contributions to the optical property of the individual chemical elements comprised in the alloy (e.g. see example 3).

The first list (i.e. Ag, Ni, Co, and Fe) consists of transition metals which have a high extinction coefficient (e.g. above 0.05). Adding these leads to a high extinction coefficient for the alloy, but an exceedingly high concentration of these in the alloy typically leads to a material which is unsatisfactory with respect to the other properties (e.g. a crystalline material).

The second list (i.e. Ru, Rh, Pd, Os, Ir, and Pt) consists of the platinoids. These elements are characterized by a moderate to high extinction coefficient (e.g. from 0.02 to 0.05) and a high density. Alloys including these elements are typically denser and the extinction coefficient of the alloy may often be higher than would be expected based on the individual elements, before taking into account this densification.

The third list (i.e. Sb and Te) consists of metalloids with a high extinction coefficient (e.g. above 0.06). These elements are glass forming elements, as such alloys formed with these elements tend to be less crystalline.

The present disclosure foresees for the combination of these elements in several ways. In a first type of embodiments, the one or more first elements may be selected from the first list and the one or more second elements may be selected from the third list. In these embodiments, an atomic ratio between the one or more first elements on the one hand and the one or more second elements on the other hand may be from 1:1 to 1:5, such as from 1:1 to 1:4. Pure Sb and Te (i.e. in their elemental forms) have a relatively low thermal stability, such as a high vapor pressure. The amount of these elements may be such that the ratio does not exceed 1:5.

In a second type of embodiments, the one or more first elements may be selected from the second list and the one or more second elements may be selected from the third list. In these embodiments, an atomic ratio between the one or more first elements on the one hand and the one or more second elements on the other hand may be from 1:1 to 1:5, such as from 1:1 to 1:4 (cf. supra).

In a third type of embodiments, the one or more first elements may be selected from the second list and the one or more second elements may be selected from the first list. In these embodiments, an atomic ratio between the one or more first elements on the one hand and the one or more second elements on the other hand may be from 1:1 to 1:19, such as from 1:2 to 1:19. Elements of the second list typically have lower extinction coefficients than elements of the first or third list. Meanwhile, elements of the first list typically have better thermal stability than elements of the third list. As such, higher ratios are possible and may be used when combining elements from the second list with elements of the first list. In embodiments, the alloy may not be pseudo palladium. Pseudo palladium (RhAg) is a binary alloy consisting of equal parts of rhodium and silver created using nanotechnological methods to achieve a more homogenous mixture than might be possible using more conventional methods. It exhibits properties of the intervening element palladium.

The optional third elements (selected from the list consisting of B, N, and P) are also glass forming elements, but these have a relatively low extinction coefficient (e.g. 0.01 or less).

The optional fourth elements (selected from the list consisting of W, Ta, Hf, Nb, and Mo) are refractory metals. These metals have a low to moderate extinction coefficient (e.g. from 0.01 to 0.04), but have a relatively high melting point. Alloys comprising these metals may therefore have their phase transitions occurring at a higher temperature (e.g. they may have a high melting point and/or a low vapor pressure). These elements may also contribute to the chemical stability of the alloy.

Since the third and fourth elements have a lower extinction coefficient than the first and second elements (i.e. those selected from the first, second or third list), their total concentration may be kept low (e.g. 20 at % or less) in order to limit their effect on the extinction coefficient of the alloy.

In embodiments, an extinction coefficient of the alloy measured at 13.5 nm may be 0.02 or higher, for example 0.04 or higher, such as 0.05 or higher, or even 0.06 or higher.

The alloy may be amorphous or nanocrystalline. In embodiments, an average crystallite size of the alloy may be 10 nm or smaller, for example 5 nm or smaller, such as 2 nm or smaller, or even 1 nm or smaller. When etching a material, such as done during subtractive patterning, the etching may typically follow a grain boundary of the material. If the material is crystalline (e.g. having an average crystallite size above 10 nm), etching a pattern in the material may therefore typically result in non-uniform etching rates and rough surface features (including a reduced line etch roughness). The alloy may thus be amorphous or only comprise small crystallites. In this respect, alloying two or more elements typically results in a material which is less crystalline than the pure elements. This effect may be more impactful when using glass forming elements and/or when alloying more than two elements. In embodiments, a crystallization temperature of the alloy may be 150° C. or higher, for example 200° C. or higher, such as 250° C. or higher, or even 400° C. or higher; an upper bound of the crystallization temperature may be 4000° C. or less, such as 1500° C. or less. In practice, the crystallization temperature is typically lower than the melting temperature; if a crystallization temperature would be higher than the melting temperature, then no crystallization temperature is typically observed. The crystallization temperature may be the one under vacuum conditions. The current maximum temperature specified for a reticle in an EUV scanner is 150° C. (which could potentially rise to e.g. 250° C. in the future), and the scanner is typically operated under vacuum; the alloy may be stable under these conditions.

In embodiments, a refractive index of the alloy measured at 13.5 nm may be between 0.86 and 1.02, such as between 0.88 and 1.00. A refractive index relatively close to 1.00 (i.e. that of vacuum or air) may minimize refraction of the EUV light by the alloy and other phase effects; as the refracted light may be reflected under a different angle or absorbed to a different extend, so as to make the reflected pattern less well defined.

In embodiments, a melting temperature of the alloy may be 150° C. or higher, for example 200° C. or higher, such as 250° C. or higher, or even 400° C. or higher (cf. supra). The melting temperature may be the one under vacuum conditions. An upper bound of the melting temperature may be 4000° C. or less, such as 1500° C. or less. In embodiments, a vapor pressure of the alloy measured at 150° C. may be $1 \times 10^{-13}$ mbar or lower. The vapor pressure may be the one under vacuum conditions. A vapor pressure of $1 \times 10^{-13}$ mbar roughly corresponds to an order of magnitude of evaporation of one monolayer per year.

In embodiments, the alloy may be a NiTe, a NiTeW, a PtTe, NiSb, a NiSbW, or a NiPtBN.

Forming the alloy may comprise a physical vapor deposition. In embodiments, the physical vapor deposition may include a co-deposition of pure elements. In other embodiments, the physical vapor deposition may comprise depositing one or more compounds. Depositing an alloy of general formula $A_xB_y$ can for example be achieved by a co-deposition from A and B, or from a deposition from $A_mB_n$. Typically the composition of the depositing compound will differ from the compound that is deposited from (i.e the target); in other words m typically differs from x and n typically differs from y. However, this effect can relatively easily be accounted for in order to achieve a desired composition.

In embodiments, any feature of any embodiment of the first aspect may be as correspondingly described for any embodiment of any other aspect.

In a second aspect, the present disclosure relates to a reticle for extreme ultraviolet lithography, comprising the alloy as defined in any embodiment of the first aspect.

In embodiments, the reticle may comprise a reflective layer and a patterned absorbing layer thereover, the patterned absorbing layer comprising the alloy as defined in any embodiment of the first aspect. The reflective layer (e.g. mirror layer) may be a Bragg reflector comprising a multilayer stack of a first material alternating with a second material, wherein the first and second material have different refractive indices and wherein the thickness of the layers is such that the optical path length within each layer corresponds to a quarter of the wavelength of the incident light (e.g. 13.5 nm EUV light). In embodiments, the reticle may further comprise a protective layer (e.g. a Ru layer) on the reflective layer. The protective layer protects the reflective layer from damage which may for example occur while providing the patterned absorbing layer or while cleaning the reticle. In some embodiments, the patterned absorbing layer could be on the protective layer.

The patterned absorbing layer may comprise at least one opening. The opening may typically extend through the entire thickness of the patterned absorbing layer, thereby for example exposing the reflective layer (or the protective layer thereon). In embodiments, the patterned absorbing layer may have a thickness of 60 nm or below, for example 50 nm or below, such as 40 nm or below, or even 35 nm or below. A lower bound of the thickness may be 20 nm or more, such as 25 nm. The patterned absorbing layer may be as thin as possible, so as to reduce 3D mask effects to the largest extent. Nevertheless, based on currently known extinction coefficients, it is not expected that the absorbing layer could have a thickness below 20 nm without severely hampering the level of absorption achieved by the layer. In embodiments, a reflectance of the absorbing layer may be 2% or less. Here the reflectance is the one measured on an unpatterned absorbing layer, or in area not comprising an opening. In embodiments, an intensity of light reflecting from atop the patterned absorbing layer may be at least 10 times smaller, such as at least 20 times smaller, than an intensity of light reflecting from within the opening. Reflecting is here understood to include both reflecting directly on a surface and any light entering the surface and subsequently re-exiting it before being absorbed. For comparison, it is noted here that a maximum reflectance of the reflecting layer is currently around 74%, while the value that is realistically achieved in practice may be around 66%.

In some embodiments, the material forming the patterned absorbing layer may consist of the alloy. In other embodiments, the patterned absorbing layer may comprise the alloy and a further material. The patterned absorbing layer may for example comprise a multilayer stack of the alloy alternating with the further material (e.g. a spacer material or a further absorber). As an alternative example of a further material, the patterned absorbing layer may comprise a capping layer overlaying the alloy. This capping layer may for example be used to facilitate optical mask inspection at non-EUV wavelengths.

In embodiments, any feature of any embodiment of the second aspect may be as correspondingly described for any embodiment of any other aspect.

In a third aspect, the present disclosure relates to a use of the alloy as defined in any embodiment of the first aspect as an extreme ultraviolet absorber.

In embodiments, the use may be in a reticle for extreme ultraviolet lithography. In these embodiments, the alloy may be comprised in a patterned absorbing layer.

It will be clear that the use of the alloy as an EUV absorber is not merely limited to its application in a patterned absorbing layer in an EUV reticle. Indeed the alloy may also be used in other parts of an EUV lithography setup or in any other technological areas where an EUV absorber is used.

In embodiments, any feature of any embodiment of the third aspect may be as correspondingly described for any embodiment of any other aspect.

In a fourth aspect, the present disclosure relates to a method for forming a reticle as defined in embodiments of the second aspect.

In some embodiments, the method may comprise:
a. providing a reflective layer;
b. providing, over the reflective layer, a layer of the alloy as defined in any embodiment of the first aspect; and
c. patterning the layer of the alloy to form the patterned absorbing layer.

This method corresponds to a subtractive patterning.

In other embodiments, the method may comprise:
a'. providing a patterned mask layer overlaying a reflective layer, the patterned mask layer comprising at least one opening therein;
b'. filling the opening with the alloy as defined in any embodiment of the first aspect, thereby forming a patterned absorbing layer; and
c'. removing the mask layer.

In embodiments, any of feature of any embodiment of the fourth aspect may be as correspondingly described for any embodiment of any other aspect.

Several embodiments will now be described. It is clear that other embodiments can be configured without departing from the technical teaching of the disclosure, the invention being limited only by the terms of the appended claims.

Example 1: $Ni_xTe_y$

Several different samples of $Ni_xTe_y$ layers were prepared by co-depositing Ni and Te on a substrate by a physical vapor deposition. The Te content in the different samples ranged from 50 at % to 70 at % (i.e. a Ni:Te ratio of 1:1 to 1:2.3) in steps of 2 at %. The substrate comprised a Si layer and a 100 nm $SiO_2$ layer thereon.

We now refer to FIG. 1, showing an in situ X-ray diffraction spectrum in function of temperature for one of these samples (64 at % Te); the same measurement was performed on the other samples, but these spectra are not shown. Diffraction peaks stemming from crystallites (i.e. small, such as microscopic, crystals) could be distinguished in the spectra as tinted stripes through increasing temperatures. The least crystalline samples were those having a Te content of 64 and 66 at %, wherein the onset of crystallinity occurred only above 200° C.; this onset is indicated by an arrow in FIG. 1. Close lying diffraction peaks of both NiTe and $NiTe_2$ were further found in all samples; these may be attributed to either a phase separation of both or to an intermediate solution phase. Three stages versus temperature were further identified, with a prominent (002) texturing. Finally, thermal stability was seen to be achieved up to at least 400° C.

Example 2: $Ni_xTe_yW_z$

Three different samples of $Ni_xTe_yW_z$ layers were prepared by co-depositing Ni, Te, and W on a substrate by a physical vapor deposition. The Ni:Te ratio in the different samples was 1:2 and the W content was 5, 10, or 15 at %. The substrate comprised a Si layer and a 100 nm $SiO_2$ layer thereon.

Figure 2:
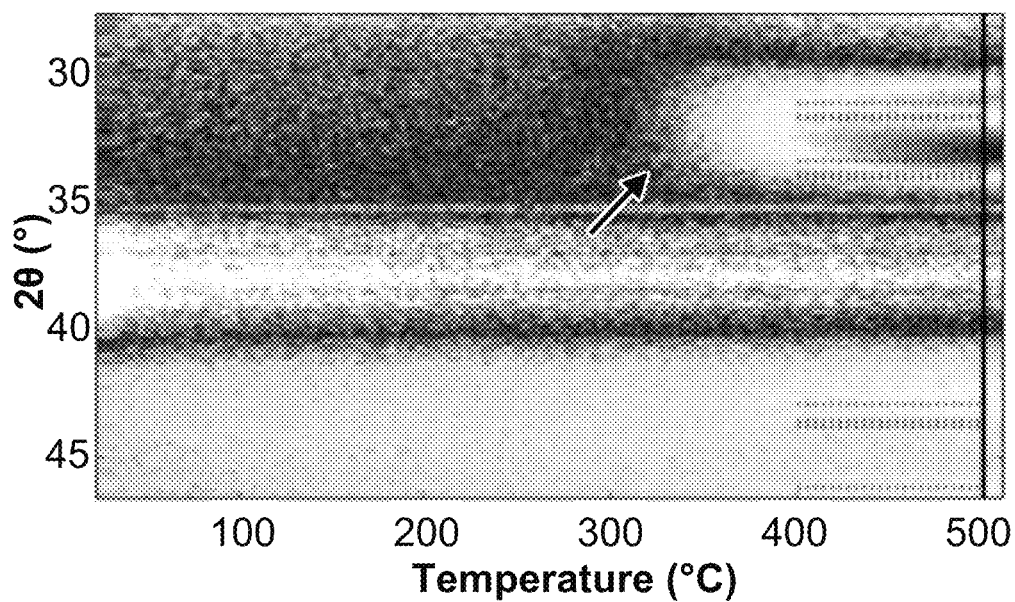
FIG. 2 is an in situ X-ray diffraction spectrum as a function of temperature, according to example embodiments.

We now refer to FIG. 2, showing an in situ X-ray diffraction spectrum in function of temperature for one of these samples (15 at % W); the same measurement was performed on the other samples, but these spectra are not shown. Diffraction peaks stemming from crystallites could be distinguished in the spectra as tinted stripes through increasing temperatures. For both of samples having a W content of 10 and 15 at %, no crystalline phase was present on deposition. Furthermore, the onset of crystallinity was postponed to about 350° C. for the sample having a W content of 15 at %; this onset is indicated by an arrow in FIG. 2. It was thus observed that adding the refractory metal W to $Ni_xTe_y$ reduced the crystallinity and improved the crystallization temperature of the alloy. No indication was found of any W related peaks in the spectra and the (002) texturing was less pronounced.

Example 3: $Pt_xTe_y$

Several different samples of $Pt_xTe_y$ layers were prepared by co-depositing Pt and Te on a substrate by a physical vapor deposition. The Te content in the different samples ranged from 57 at % to 67 at % (i.e. a Pt:Te ratio of 1:1.3 to 1:2) in steps of 2 at %. The substrate comprised a Si layer and a Ru protective layer thereon.

Figure 3:
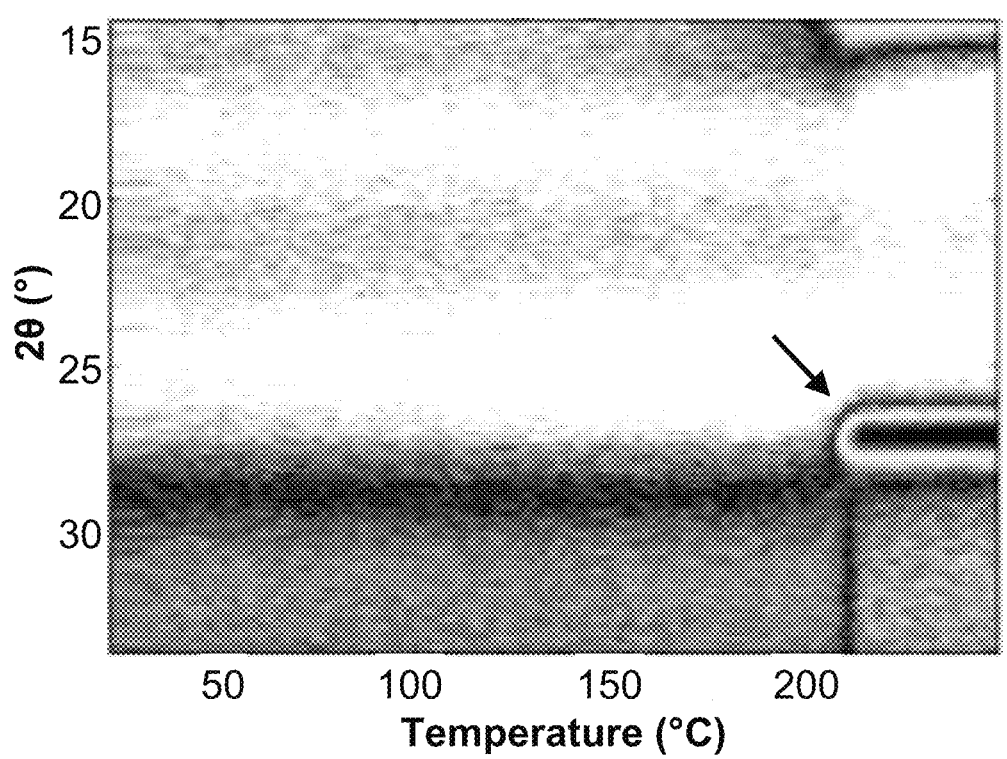
FIG. 3 is an in situ X-ray diffraction spectrum as a function of temperature, according to example embodiments.

We now refer to FIG. 3, showing an in situ X-ray diffraction spectrum in function of temperature for one of these samples (63 at % Te); the same measurement was performed on the other samples, but these spectra are not shown. Diffraction peaks stemming from crystallites could be distinguished in the spectra as tinted stripes through increasing temperatures. In this case, the onset of crystallinity always occurred around 210° C., irrespective of the Te content; this onset is indicated by an arrow in FIG. 3. A $PtTe_2$ diffraction peak was found in the sample with the highest Te content (67 at %).

A sample with a Te content of 50 at % (i.e. a Pt:Te ratio of 1:1) was also prepared as earlier described. The exact composition of the alloy was then determined using Rutherford backscattering spectroscopy (RBS), which gives a count of the areal atomic density and confirmed the ratio to be 1:1 within the measuring error. Also X-ray reflectivity (XRR) measurements were performed on this sample, in order to gain information on layer thicknesses and densities. A PtTe layer thickness of about 22 nm was obtained, having a density of 11.06 g/cm³ (as determined by XRR). A small layer of $TeO_3$ was also present on the PtTe layer; the combination of the PtTe layer and the $TeO_3$ layer amounting to a total thickness of 23.78 nm.

Figure 4:
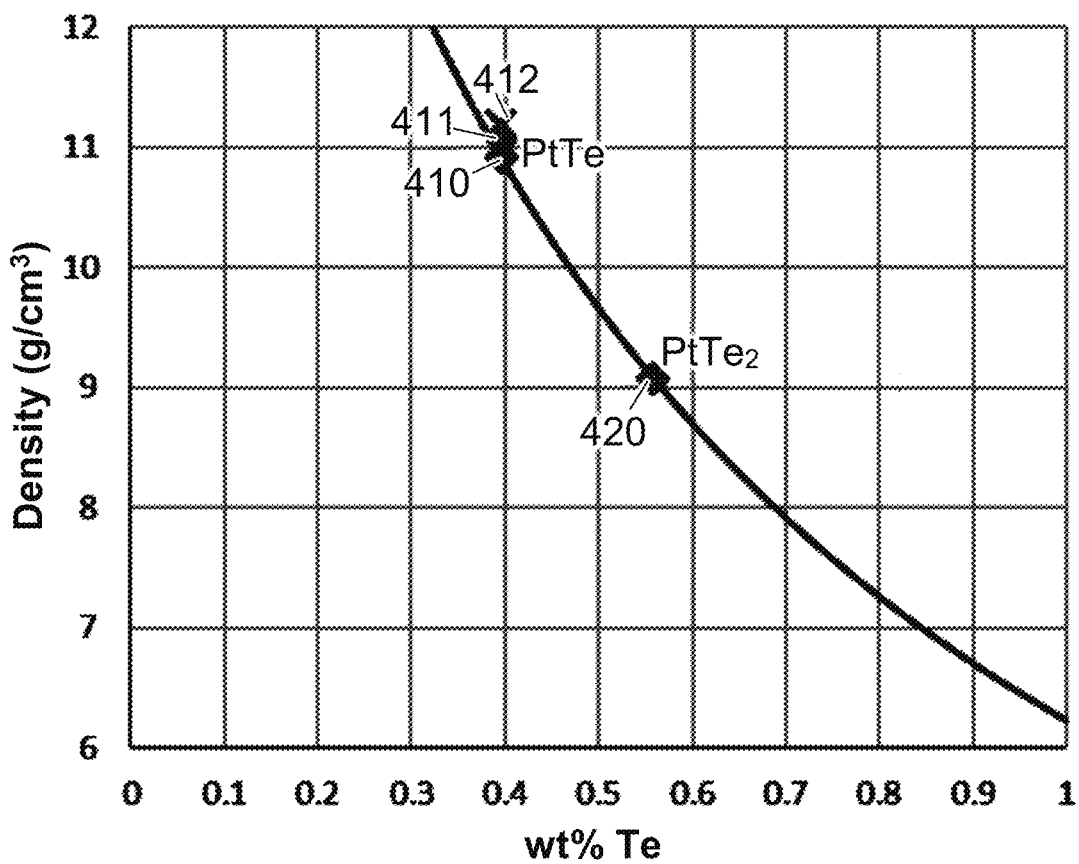
FIG. 4 is a graph of the $Pt_xTe_y$ density as a function of the Te content, according to example embodiments.

We now refer to FIG. 4, showing the $Pt_xTe_y$ density in function of the Te content (in wt %). Note that a Pt:Te ratio of 1:1 corresponds to a Te content of 40 wt %. The curve in FIG. 4 corresponds to the theoretical approximation of the density ($\rho_{alloy}$), based on the formula $$\frac{1}{\rho_{alloy}} = \sum_i \frac{w_i}{\rho_i},$$

wherein the summation is performed over each element in the alloy, $w_i$ is the concentration of an element in the alloy (in wt %) and $\rho_i$ is the density of the pure element. The location of both PtTe (i.e. Pt:Te ratio of 1:1; 410) and $PtTe_2$ (i.e. Pt:Te ratio of 1:2; 420) have been marked on this curve. Furthermore, also the densities of PtTe as directly measured through XRR (411) and as obtained from combining the information from RBS and XRR (412) are indicated in FIG. 4. In combining RBS and XRR, the density is calculated from the areal atomic density obtained from RBS, the thickness obtained from XRR and the atomic mass as is generally known. This value amounted to 11.2 g/cm³ and may be considered as the most accurate PtTe density.

Figure 5:
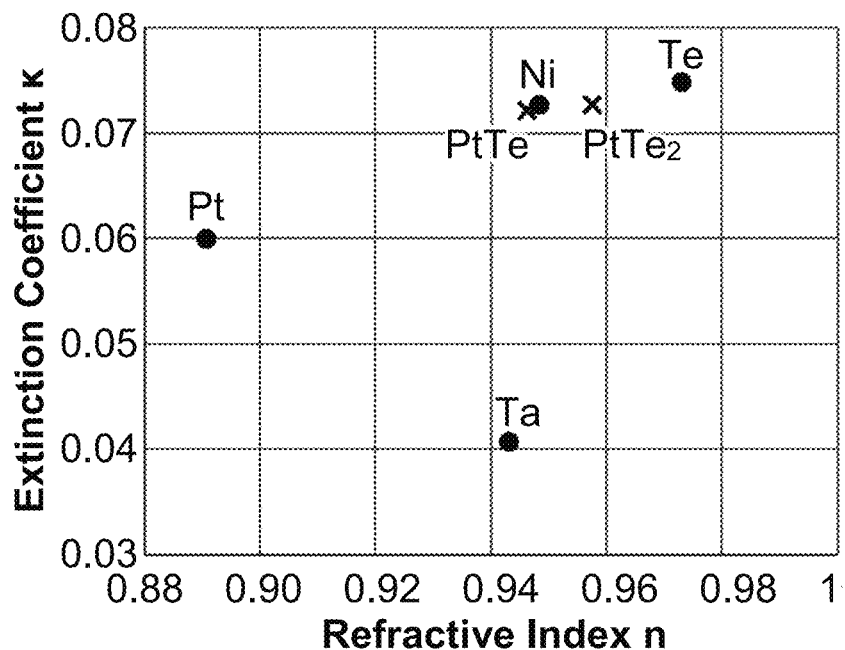
FIG. 5 is a graph of the extinction coefficient κ as a function of the refractive index n for a number of materials at a wavelength of 13.5 nm, according to example embodiments.

We now refer to FIG. 5, showing the extinction coefficient κ in function of the refractive index n for a number of materials at a wavelength of 13.5 nm. These materials include pure Pt and Te, Ta (of which it is instructive to compare to, given that its alloys are today the most commonly used EUV absorbers in EUV lithography), and Ni (which has better optical properties than Ta, but which is challenging to pattern). Furthermore, estimates of the extinction coefficient and the refractive index of PtTe and $PtTe_2$ were calculated using the information in FIG. 4, using the online calculator (http://henke.lbl.gov/optical_constants/getdb2.html) of the Center for X-Ray Optics (http://www-.cxro.lbl.gov/). This calculator allows the extinction coefficient κ and the index of refraction n to be calculated based on an input of the alloy composition, the density and the wavelength; using tabulated values for molar masses and form factors. For example, the extinction coefficient of the alloy ($\kappa_{alloy}$) may be calculated using the formula:

$$\kappa_{alloy} = \frac{f_{2,alloy}}{M_{alloy} \sum_i w_i \frac{f_{2,i}}{\kappa_i \cdot M_i}} \text{ with } M_{alloy} = \sum_i w_i M_i,$$

wherein κ is the extinction coefficient, $f_2$ is the imaginary part of complex form factor, M is the molar mass, w is the weight percentage, the subscripts "alloy" and "i" respectively indicate that the property pertains to the alloy or to an element comprised therein (e.g. Pt and Te in this example) and wherein the summation is performed over each element.

As is seen in FIG. 5, the optical properties of both PtTe and $PtTe_2$ compare favorably to Ta. Furthermore, they are very close to those of metallic Ni, while being easier to pattern (among others because of the low crystallinity). Note also that, while the extinction coefficient of Pt is considerably lower, alloying Te with Pt only lowers the extinction coefficient by a relatively small amount. This is due to the increased density of $Pt_xTe_y$ compared to pure Te and illustrates the benefit of alloying with platenides.

Figure 6:
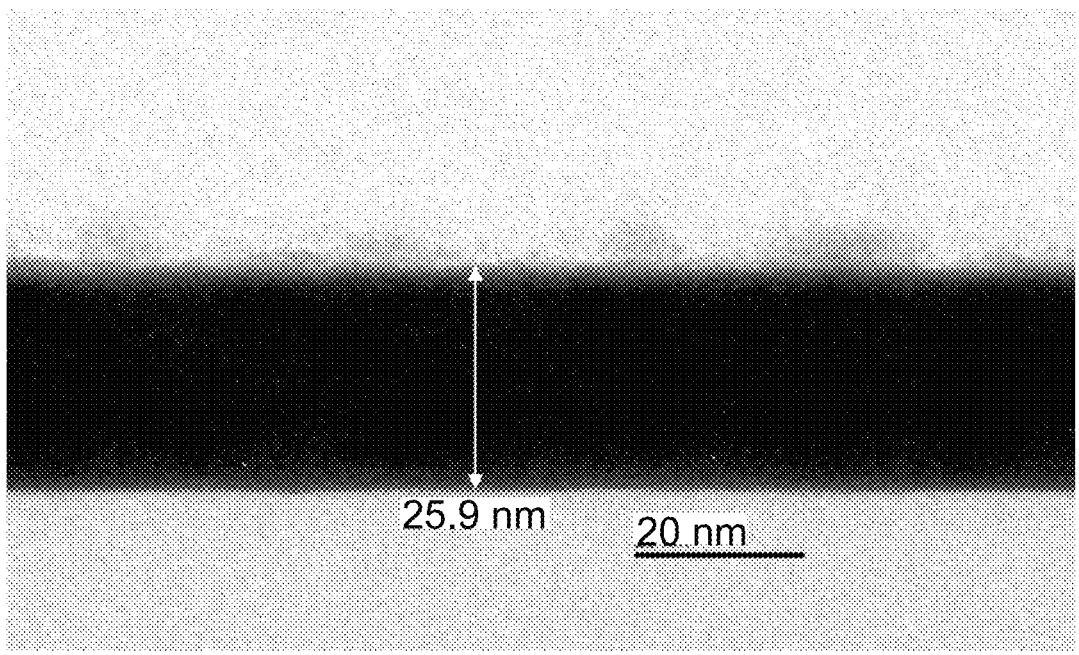
FIG. 6 is a transmission electron microscopy image of a PtTe layer, according to example embodiments.

We now refer to FIG. 6, showing a transmission electron microscopy image of a PtTe layer prepared as outlined above. Indicated in FIG. 6 are the scale of the image and a readout of the thickness of the layer (i.e. 25.9 nm). While the surface was somewhat rough, an otherwise uniform film without crystallinity (i.e. without visible grains) was observed.

Figure 7:
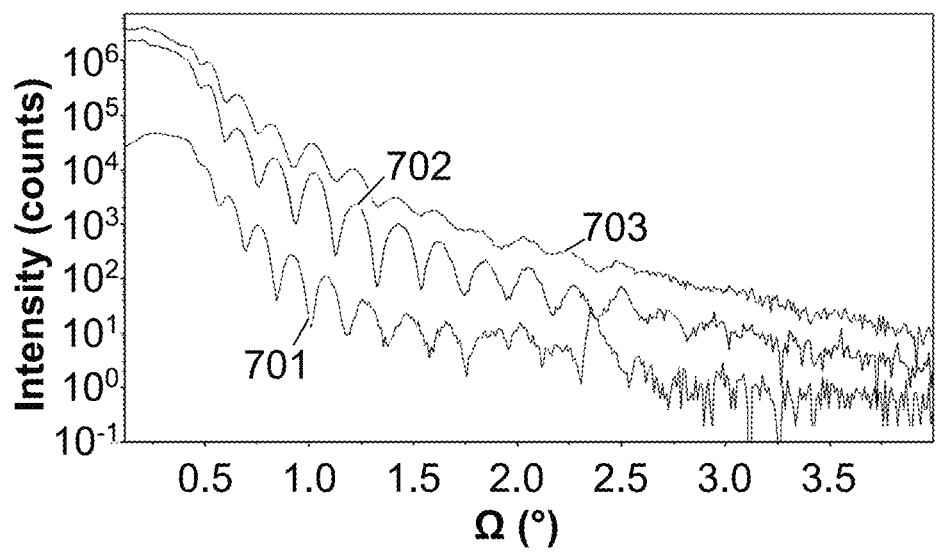
FIG. 7 is a graph showing X-ray reflectivity measurements of PtTe samples after a cleaning test and of a PtTe reference sample, according to example embodiments.

We now refer to FIG. 7, showing XRR measurements comparing PtTe samples (702, 703) after a cleaning test with a PtTe reference sample (701). The cleaning test comprised exposing the layer in a beaker to a solution of either $NH_4OH$ (pH 11.4; 702) or deionized water (pH 5.7; 703) for 24 hours. Some change in thickness was observed in the XRR measurements for both cleaning chemistries, indicating that PtTe reacted with both cleaning chemistries, but the layers were nevertheless still intact.

Example 4: $Ni_xPt_yB_zN_m$ $Ni_xPt_yB_zN_m$ layers are prepared similarly to the previous examples by co-depositing Ni, Pt, and B in a N atmosphere (e.g. N plasma) on a substrate by a physical vapor deposition. Comparable results as in the previous examples are obtained.

Example 5: $Ni_xSb_y$, $Ni_xSb_yW_z$ and $Pt_xSb_y$ $Ni_xSb_y$, $Ni_xSb_yW_z$, and $Pt_xSb_y$ layers are prepared by exchanging Te for Sb in examples 1 to 3. Comparable results are obtained.

It is to be understood that although embodiments, specific constructions and configurations, as well as materials, have been discussed herein for devices, various changes or modifications in form and detail may be made without departing from the scope and technical teachings of this disclosure.

For example, any formulas given above are merely representative of procedures that may be used. Functionality may be added or deleted from the block diagrams and operations may be interchanged among functional blocks. Steps may be added or deleted to methods described within the scope of the present disclosure.

What is claimed is:

1. A reticle for extreme ultraviolet lithography, comprising:
   an alloy comprising:
      one or more first elements selected from only one of:
         a first list consisting of: Ag, Ni, Co, and Fe; and
         a second list consisting of: Ru, Rh, Pd, Os, Ir, and Pt; and
      one or more second elements selected from only one of:
         the first list, if the one or more first elements are not selected from the first list; and
         a third list consisting of Sb and Te,
      wherein an atomic ratio between the one or more first elements and the one or more second elements is between 1:1 and 1:5 if the one or more second elements are selected from the third list and between 1:1 and 1:19 if the one or more second elements are not selected from the third list.

2. The reticle according to claim 1, wherein the reticle comprises a reflective layer and a patterned absorbing layer thereon, and wherein the patterned absorbing layer comprises the alloy.

3. The reticle according to claim 2, wherein the patterned absorbing layer has a thickness of 60 nm or below.

4. The reticle according to claim 1, wherein an average crystallite size of the alloy is 10 nm or smaller.

5. The reticle according to claim 1, wherein an extinction coefficient of the alloy measured at 13.5 nm is 0.02 or higher.

6. The reticle according to claim 1, wherein a refractive index of the alloy measured at 13.5 nm is between 0.86 and 1.02.

7. A method for forming a reticle for extreme ultraviolet lithography, comprising:
   providing a reflective layer;
   providing, over the reflective layer, an alloy, wherein the alloy comprises:
      one or more first elements selected from only one of:
         a first list consisting of: Ag, Ni, Co, and Fe; and
         a second list consisting of: Ru, Rh, Pd, Os, Ir, and Pt; and
      one or more second elements selected from only one of:
         the first list, if the one or more first elements are not selected from the first list; and
         a third list consisting of Sb and Te,
      wherein an atomic ratio between the one or more first elements and the one or more second elements is between 1:1 and 1:5 if the one or more second elements are selected from the third list and between 1:1 and 1:19 if the one or more second elements are not selected from the third list; and
   patterning the alloy to form a patterned absorbing layer.

* * * * *